United States Patent [19]
Lee et al.

[11] Patent Number: 5,872,390
[45] Date of Patent: Feb. 16, 1999

[54] FUSE WINDOW WITH CONTROLLED FUSE OXIDE THICKNESS

[75] Inventors: Pei-Ing Paul Lee, LaGrangeville, N.Y.; William Alan Klaasen, Underhill, Vt.; Alexander Mitwalsky, Poughkeepsie, N.Y.

[73] Assignee: International Business Machines Corporation, Armonk, N.Y.

[21] Appl. No.: 911,542

[22] Filed: Aug. 14, 1997

Related U.S. Application Data

[63] Continuation of Ser. No. 519,976, Aug. 28, 1995, abandoned.

[51] Int. Cl.$^6$ .................................................. H01L 29/00
[52] U.S. Cl. ......................... 257/529; 257/637; 257/638; 257/665
[58] Field of Search ................................... 257/529, 637, 257/638, 665

[56] References Cited

U.S. PATENT DOCUMENTS

| | | | |
|---|---|---|---|
| 4,536,949 | 8/1985 | Takayama et al. | 257/529 |
| 4,628,590 | 12/1986 | Udo et al. | 257/529 |
| 5,025,300 | 6/1991 | Billig et al. | 257/529 |
| 5,126,283 | 6/1992 | Pintchovski et al. | 437/188 |
| 5,248,632 | 9/1993 | Tung et al. | 437/195 |
| 5,303,199 | 4/1994 | Ishihara et al. | 365/225.7 |
| 5,329,152 | 7/1994 | Janai et al. | |
| 5,374,832 | 12/1994 | Tung et al. | 257/50 |
| 5,444,012 | 8/1995 | Yoshizumi et al. | 257/529 |
| 5,578,861 | 11/1996 | Kinoshita et al. | 257/529 |

FOREIGN PATENT DOCUMENTS

| | | |
|---|---|---|
| 0089814 | 3/1983 | European Pat. Off. . |
| 92/19009 | 4/1992 | WIPO . |

OTHER PUBLICATIONS

"Process and Structure for Laser Fuse Blowing", *IBM Technical Disclosure Bulletin*, vol. 31, No. 12 (May 1989) p. 93.

*Primary Examiner*—J. Carroll
*Attorney, Agent, or Firm*—Alison D. Mortinger

[57] ABSTRACT

A fuse window structure and method for forming the same for a semiconductor device with a fuse and a cutting site on the fuse, the structure having (1) a first oxide region substantially in register with the cutting site, the first oxide region having a first thickness, (2) a second oxide region substantially in register with a first land generally surrounding the cutting site, the first land generally in register with the fuse, the second region having a second thickness, and (3) a third oxide region substantially in register with a second land generally surrounding the fuse, the third region having a third thickness different than the first thickness. Different fuse window structures are formed by using etch stops with different configurations, each configuration differing with regard to coverage of the three oxide regions.

3 Claims, 8 Drawing Sheets

FUSE WINDOW WITH CONTROLLED FUSE OXIDE THICKNESS

The application is a continuation of application Ser. No. 08/519,976, filed Aug. 28, 1995 abandoned.

FIELD OF THE INVENTION

This invention is directed to semiconductor fuse structures, and more particularly to controlling the thickness of oxide overlying the fuse to promote reliable laser cutting of the fuse.

BACKGROUND OF THE INVENTION

Redundancy in integrated circuit memories is part of current chip manufacturing strategy to improve yield. By replacing defective cells with redundant circuits on chips, integrated circuit memory yields are significantly increased. The practice is to cut or blow conductive connections (fuses) which allow redundant memory cells to be used in place of nonfunctional cells. In the manufacture of integrated circuits, it is also common practice to provide for customization of chips and modules to adapt chips to specific applications. In this way, a single integrated circuit design may be economically manufactured and adapted to a variety of custom uses.

Typically, fuses or fusible links are incorporated in the integrated circuit design, and these fuses are selectively blown, for example, by passing an electrical current of sufficient magnitude to cause them to open. An alternative to blowing fuse links with a current is to open a window above the fuses, use a laser to blow the fuses, and then fill the window with a passivating layer. During the fuse blow process, care must be taken to properly align the laser so that the circuit is not damaged by an improperly aimed laser beam.

As circuit density has increased, the number of metallization levels and interlevel dielectric (ILD) levels above the substrate has increased. However, the fuse links usually stay close to the substrate surface (e.g. word line or bit line). Due to the increased total ILD thickness above fuse lines, a well-controlled etch in order to open the fuse window and leave a desired oxide thickness on top of the fuse links is extremely difficult. For example, a fuse etch typically requires etching of 3 μm dielectric layers for a 3 metal layer integrated circuit product (excluding other dielectric such as polyimide). Achieving a ±10% etch (i.e. ±0.3 μm) uniformity is a very challenging task with existing etch technology.

Several factors contribute to oxide nonuniformity. As more layers of metallization and dielectric layers are employed, pre-etch nonuniformity increases due to nonuniformities from previous process steps such as film deposition, planarization, and etching. The dielectric thickness prior to fuse window etch has been observed to be 3 μm with a variation of ±0.2 μm.

In addition, during the fuse window etch the oxide is not uniformly etched. With reactive ion etching (RIE), RIE lag is one cause. When feature sizes differ, RIE lag results in a narrower feature (i.e. narrower "hole" to be etched) to be etched less deeply than a wider feature. Reverse RIE lag is another cause of nonuniformity, in which narrower features are etched more deeply than wider features. Other conditions can cause nonuniformity, and in general the oxide thickness after fuse window etch has been observed to vary from 1000 Å near the edge of the window to 5000 Å near the center of the window.

A uniform fuse oxide is very important. If the oxide is nonexistent, fuse corrosion is a concern; if very thin (i.e. <2000 Å), then fuse cracks are likely which cause yield loss and reliability concerns. Fuse cracks, also called stress cracks, are common at the corner of a fuse window where the oxide tends to be thin. On the other hand, if the oxide is too thick (i.e. >8000 Å) a high laser fusing energy is required to reliably blow the fuse. Furthermore, the laser energy required to blow fuses with thicker oxide, between 7000 and 8000 Å, can easily lead to substrate damage, again causing yield loss and reliability concerns. Uniform oxide thickness across the fuse window and within the desired range would be optimal.

In addition, an auxiliary but not unimportant concern with fuse window etching and oxide thickness control is minimization of total etch process time. Another concern is the ability to handle laser misalignment without damaging the surrounding structures or layers.

Thus there remains a need for controlled etching of a fuse window above a fuse link in order to achieve uniform fuse oxide thickness, so that a repeatable, commercially viable fuse blow process can be performed in an integrated circuit production environment.

SUMMARY OF THE INVENTION

It is therefore an object of the present invention to provide a fuse window structure with controlled oxide thickness above a fuse link in an integrated circuit.

It is a further object to reduce the concern of laser misalignment in fuse etching.

It is another object to reduce the overall fuse etch process time.

In accordance with the above listed and other objects, a fuse window structure is provided for a semiconductor device which has a fuse formed on a substrate, with the fuse having a cutting site. The fuse window structure has (1) a first oxide region substantially in register with the cutting site, the first oxide region having a first thickness, (2) a second oxide region substantially in register with a first land generally surrounding the cutting site, the first land generally in register with the fuse, the second region having a second thickness, and (3) a third oxide region substantially in register with a second land generally surrounding the fuse, the third region having a third thickness different than the first thickness.

In a first embodiment, the first oxide region is less thick than the second oxide region, and the second and third oxide regions have substantially the same thickness. With this embodiment, the fuse window structure is formed by removing subsequent layers overlaying the first, second, and third oxide regions, with the subsequent layers including an etch stop overlaying the first, second and third oxide regions.

In a second embodiment, the first oxide region and second oxide regions have substantially the same thickness, and the third oxide region is less thick than the first and second regions. With this embodiment, the fuse window structure is formed by removing subsequent layers overlaying the first, second, and third oxide regions, with the subsequent layers including an etch stop overlaying the first and second oxide regions.

A method is also provided for controlling oxide thickness in a semiconductor device above a fuse for a fuse blow process, including the steps of forming an oxide layer overlaying the fuse; and forming an etch stop in the oxide layer, the etch stop overlaying the fuse to form (a) a first oxide region substantially in register with a cutting site of the fuse, the first oxide region having a first thickness above the cutting site, (b) a second oxide region substantially in register with a first land surrounding the cutting site and wherein the first land substantially overlays the fuse, the second region having a second thickness, and (c) a third oxide region substantially in register with a second land surrounding the fuse, the third region having a third thickness different than the first thickness.

BRIEF DESCRIPTION OF THE DRAWINGS

These and other features, aspects, and advantages will be more readily apparent and better understood from the following detailed description of the invention, in which:

FIG. 1b is a top view of the etch stop from FIG. 1a;

DESCRIPTION OF THE PREFERRED EMBODIMENT

Figure 1A:
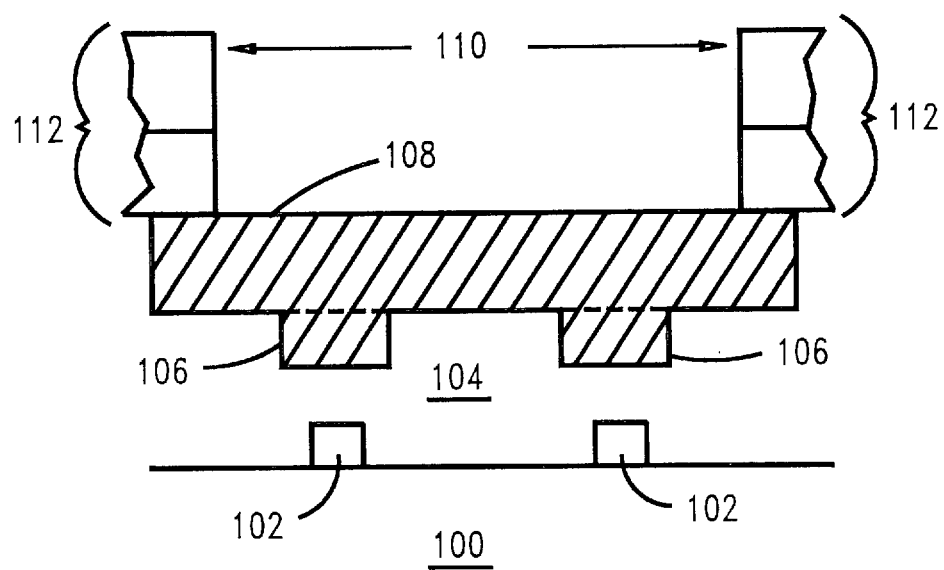
FIG. 1a is a cross-section of an etch stop for fuse oxide thickness control.

Referring now to the drawings and more particularly to FIG. 1a, a cross section of an etch stop to form a fuse window with controlled fuse oxide thickness is shown. Fuses 102 are formed via any conventional process on a substrate 100 which may include other circuit elements below fuses 102 (not shown). A layer of oxide 104 is formed over fuses 102, and patterned so that a first etch stop layer 106 can be formed only above the cutting sites ("blow sites") of fuses 102. (The cutting sites are more clearly shown in FIG. 1b.) A second etch stop layer 108 is formed above layer 106, with layer 108 covering the entire fuse window 110. Note that in FIG. 1a etch stop layer 108 actually extends beyond the edge of the fuse window and into the surrounding layers. This extension is desirable in order to compensate for lithography overlay requirements during manufacturing.

Subsequent layers 112 are formed over etch stop layer 108 in accordance with the overall circuit design, and may include additional layers of metal. During the terminal via and fuse etch process steps, fuse window 110 is anisotropically etched through layers 112 (preferably by reactive ion etching, or RIE) down to etch stop layer 108. FIG. 1a shows fuse window 110 after such an anisotropic etch step.

Figure 1B:
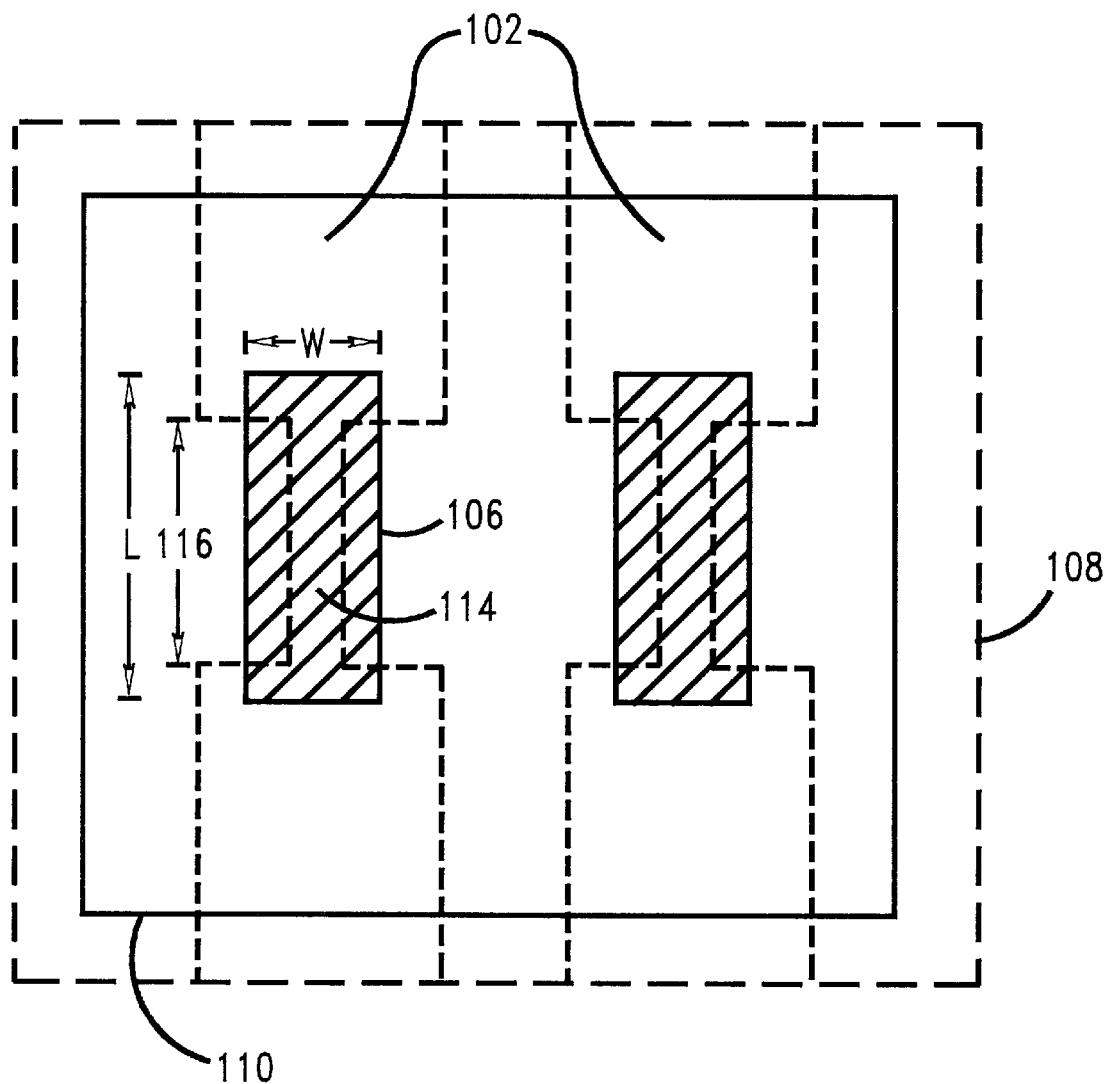

FIG. 1b shows the top view of the multilayer etch stop structure from FIG. 1a. Layer 108 is shown as a dashed line because it extends underneath the edges of layers 112 surrounding fuse window 110. Layer 106 (beneath layer 108) covers the narrowed region, or cutting site, 114 of fuse 102. As shown, layer 106 has width W and length L. In the preferred embodiment, W is greater than the width of cutting site 114, and L is greater than fuse length 116 to insure complete after-etch oxide coverage of cutting site 114, but these dimensions may vary.

Figure 1C:
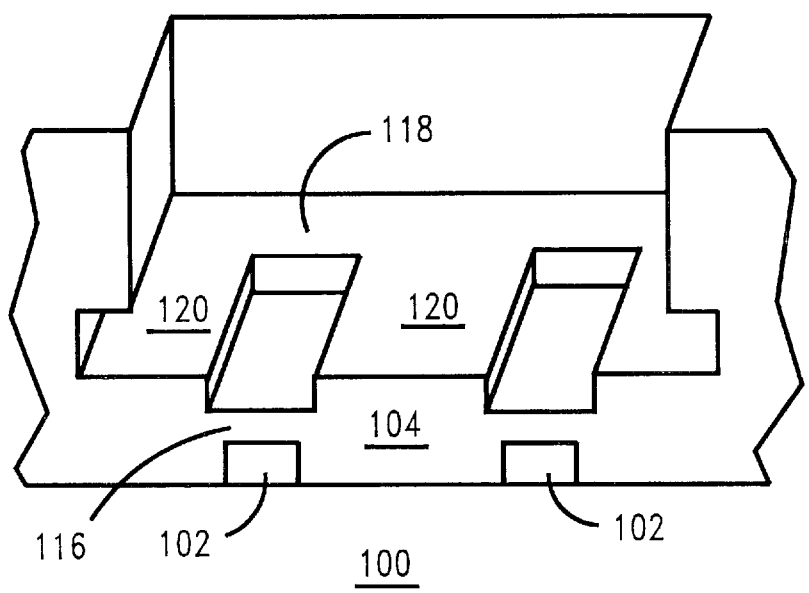
FIG. 1c is a cross-sectional perspective view of the fuse window after the etch stop of FIG. 1a has been removed.

FIG. 1c shows a cross-section of fuse window 110 after etch stop layers 106 and 108 have been removed by an isotropic etch which is highly selective to the etch stop material used in layers 106 and 108. Because oxide 104 is not affected during the etch stop removal, the profile of oxide 104 is controlled to be uniformly thin in region 116 above cutting site 114, and uniformly thick in region 118 overlaying the rest of fuse 102 as well as region 120 surrounding fuse 102. Thick oxide in region 118 prevents stress cracks, and thick oxide in region 120 provides mechanical stability to the structure as well as reduces substrate damage during the laser blow process.

Etch stop layers 106 and 108 may be formed by conventional mask design, and are preferably formed in the metal level above the fuse level of the integrated circuit so that a minimum fuse oxide thickness is achieved above fuse cutting site 114. The etch stop material used in layers 106 and 108 is preferably different than metal in levels above the etch stop so that during the removal of etch stop layers 106 and 108, the upper level metal will not be affected.

To form etch stop layers 106 and 108, any material or combination of materials that function as an etch stop for a fuse etch process may be used. However, the material should have a high etch selectivity to the oxide underneath the etch stop for the isotropic etch, and be able to be completely stripped without affecting the layers outside fuse window 110, including layers 112. Preferable etch stop materials are, for example, titanium, molybdenum, tungsten, chromium, and their silicides and nitrides. An ideal exemplified material is Ti/TiN/W which is routinely used in the semiconductor industry as a via stud or wiring interconnect. The titanium, titanium nitride, and tungsten can be selectively removed by hot hydrogen peroxide without attacking layers 112 which may include a last level metal (typically an aluminum alloy) and dielectrics (typically polyimide, silicon nitride, and silicon oxide).

An added benefit of the etch stop is significant time savings for the fuse window etch process. With an interlevel dielectric level (ILD) thickness of 3.0 $\mu$m, the addition of the etch stop means less ILD to etch, and then a relatively quick isotropic etch follows to remove the etch stop. Also, without an etch stop the RIE process conditions must be less aggressive in order to etch with as much uniformity as possible, and therefore the etch takes longer. With an etch stop structure such as layers 106 and 108, the etching will automatically terminate at the etch stop, and thus the process conditions can be more aggressive and take less time to remove the same amount of material. The inventors have observed a reduction in total etch time of about 35% per wafer, compared to RIE without an etch stop.

ALTERNATE EMBODIMENTS

Figure 2:
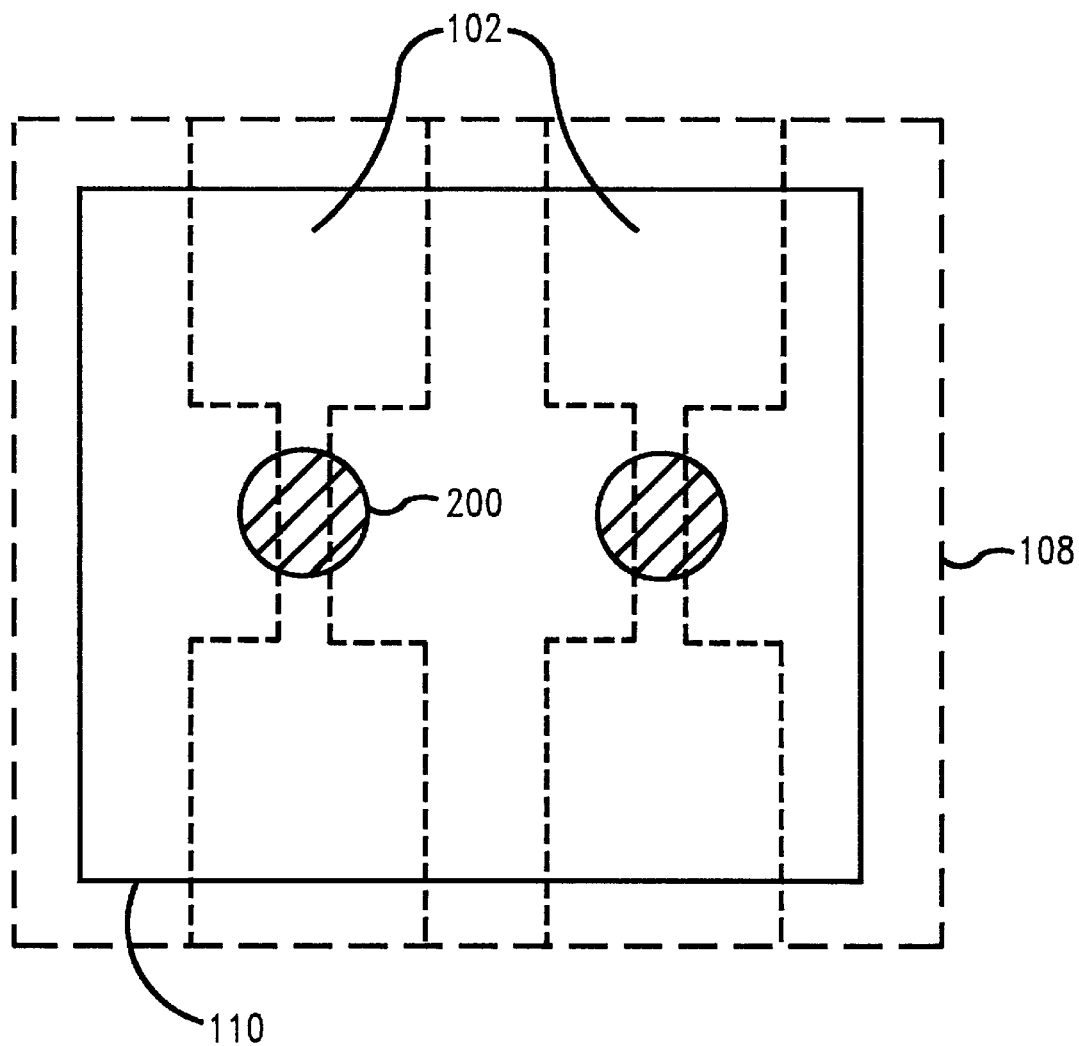
FIG. 2 is a top view of a first alternate etch stop.

FIG. 2 shows a top view of a first alternate embodiment of the etch stop. First etch stop layer 200 has a generally circular shape, and second layer 108 is unchanged from the configuration as illustrated in FIGS. 1a and 1b. The advantage of the circular shape for layer 200 over rectangular etch stop layer 106 is that the resulting circular oxide portion of fuse window 110 on top of fuse 102 acts as a lens and the laser can be better focused for fuse blowing. Such focusing will reduce unwanted laser scattering into adjacent areas of the integrated circuit and laser efficiency will be enhanced for a better fuse blow. Other shapes can be used to form different fuse windows and thus achieve optimal laser efficiency, for example a grid design (e.g. a Fresnel Lens type). A grid design (not shown) can be used to focus a laser on a specific portion of the fuse link to achieve an even more effective fuse blow.

Figure 3A:
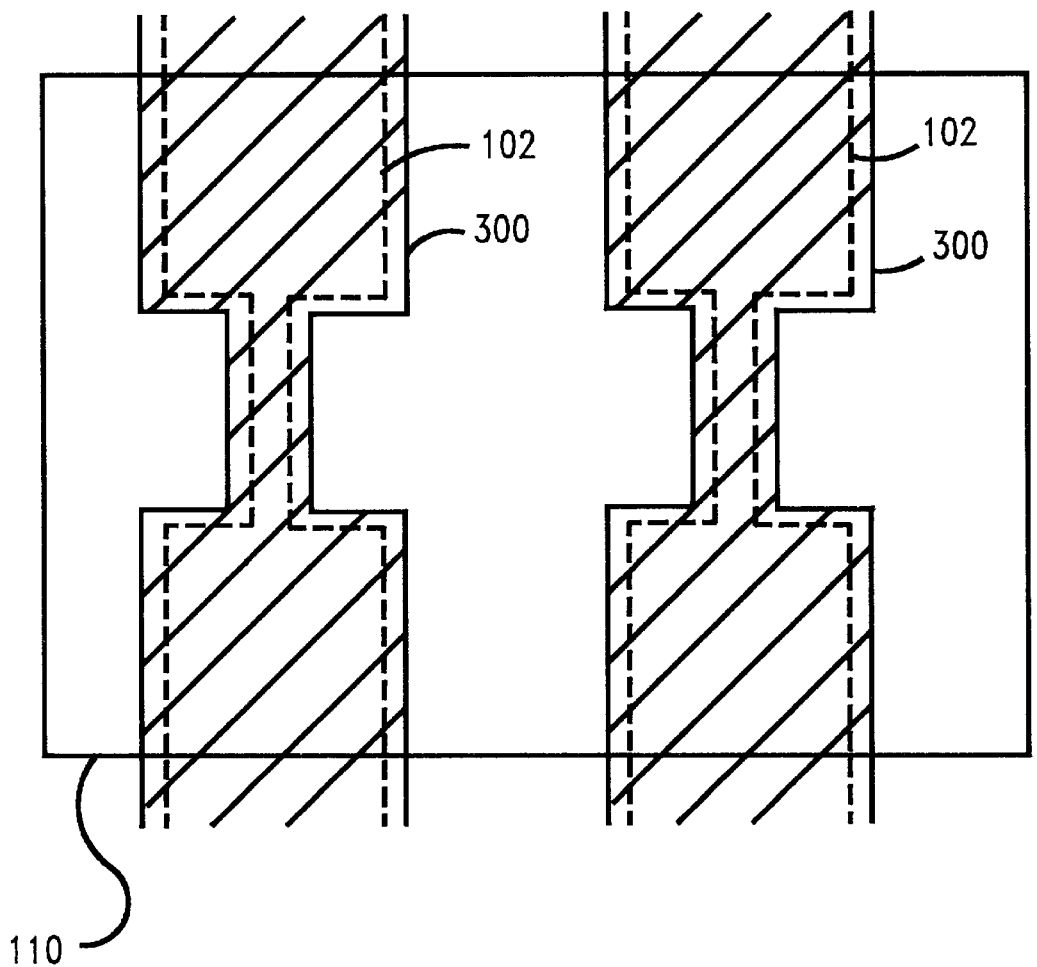
FIG. 3a is a top view of a second alternate etch stop.
Figure 3B:
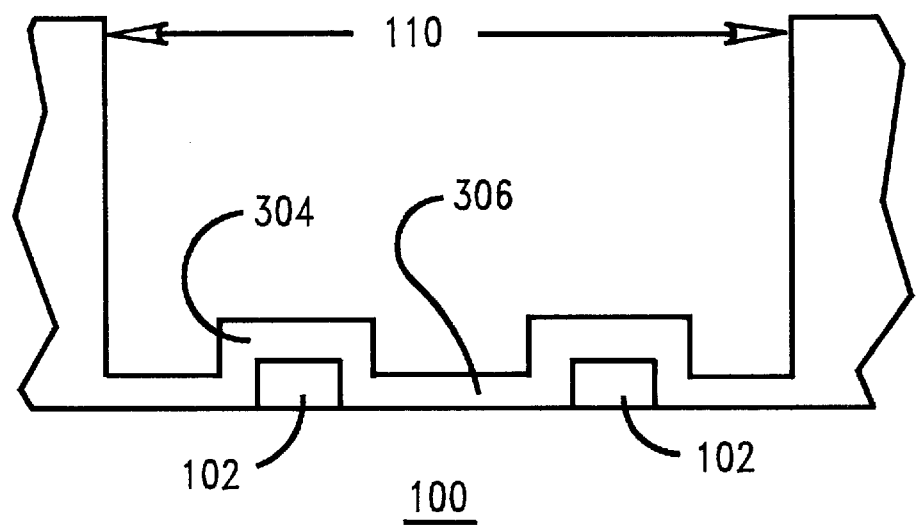
FIG. 3b is an cross-section of the fuse window after the etch stop of FIG. 3a has been removed.

A second alternate embodiment of the etch stop is shown in FIG. 3a, for cases where oxide thickness between fuses is less important. A single layer patterned etch stop 300 is used for each fuse 102, with the dimensions of etch stop 300 roughly equal to the dimensions of fuse 102 plus a safety margin to allow for any isotropic character of the RIE etch. FIG. 3b shows the fuse window after etch stop 300 has been removed. Oxide region 304 resembling a fuse-shaped island will be left on top of the entire fuse 102, and a thin region 306 will be left surrounding fuse 102. Oxide region 304 larger than fuse 102 will compensate for any laser misalignment during the fuse blow process.

Figure 4A:
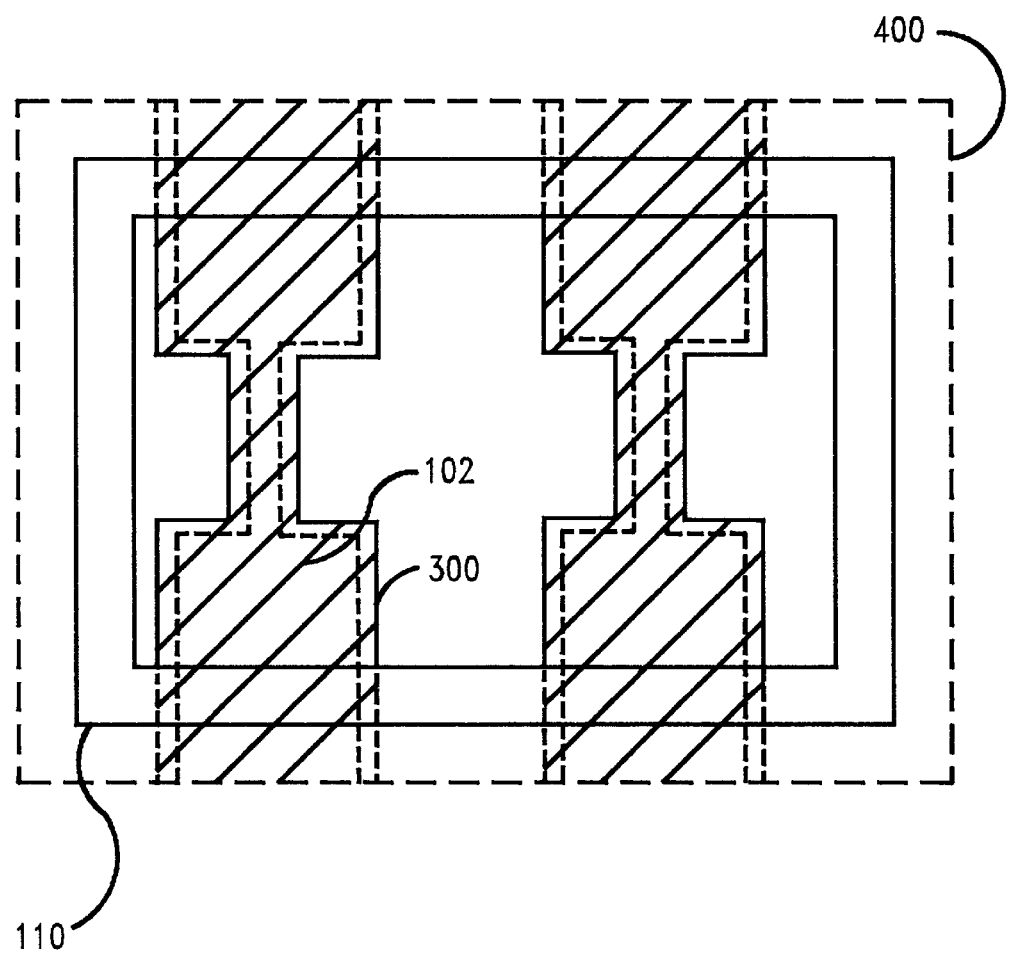
FIG. 4a is a top view of a third alternate etch stop.
Figure 4B:
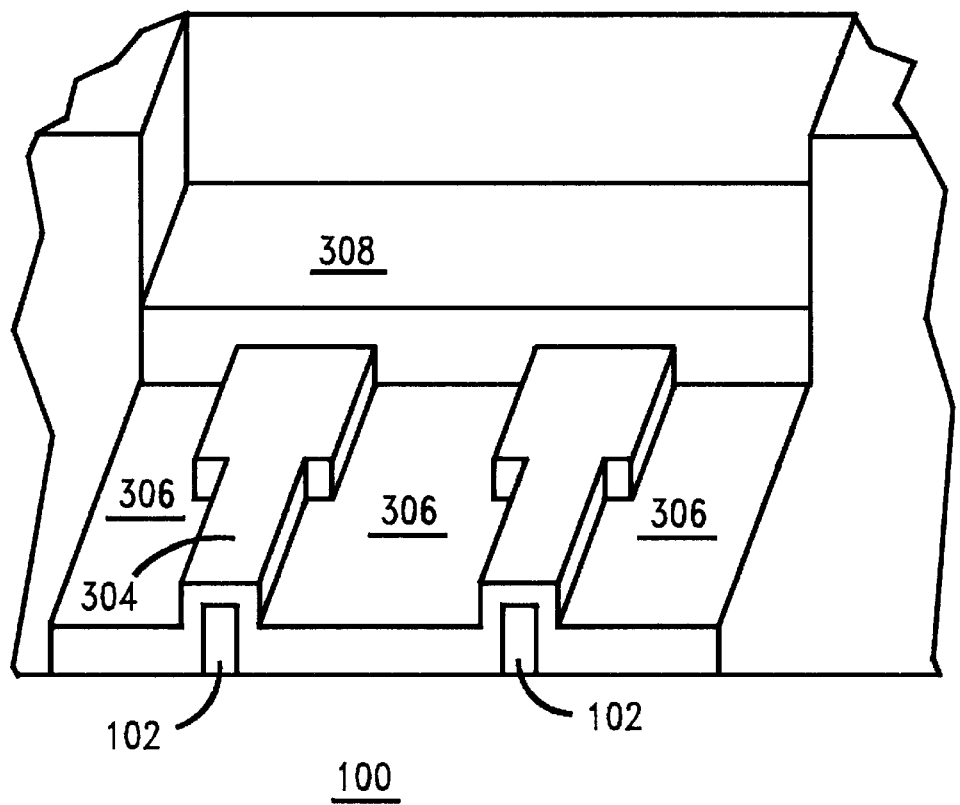
FIG. 4b is a cross-sectional perspective view of the fuse window after the etch stop of FIG. 4a has been removed; all in accordance with the present invention.

A third alternate embodiment of the etch stop structure is shown in FIGS. 4a and 4b. First etch stop layer 300 is the same as was illustrated in FIG. 3a from the second embodiment, and a second etch stop layer 400 has been added. Second etch stop layer 400 is positioned above layer 300, but only at the stress crack sensitive edges of fuse window 110. The vertical placement of second etch stop layer 400 is dependent upon the design constraints of the semiconductor device, but is preferably in a layer relatively close to first etch stop layer 300. FIG. 4b shows fuse window 110 after etch stop layers 300 and 400 have been removed. The use of etch stop layer 400 results in an oxide region 308 at the edges of the window. (Note that oxide region 308 will extend around the perimeter of the window but is only shown on one side for ease of illustration.) Oxide region 308 is thicker than oxide region 304, which is in turn thicker than oxide region 306.

In summary, a means has been provided for controlled etching of a fuse window above a fuse link in order to achieve uniform fuse oxide thickness, so that a repeatable, commercially viable fuse blow process can be performed in an integrated circuit production environment.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A fuse window structure for a semiconductor device, the semiconductor device having a fuse formed on a substrate, the fuse having a cutting site, the fuse window structure comprising: a first oxide region within the window substantially in register with the cutting site, the first oxide region having a first height from the substrate; a second oxide region within the window substantially in register with a first land generally surrounding the cutting site, the first land generally in register with the fuse, the second region having a second height from the substrate; a third oxide region within the window substantially in register with a second land generally surrounding the fuse, the third region having a third height from the substrate, and wherein the first height from the substrate is less than the second height from the substrate, and the second height from the substrate is substantially the same as the third height from the substrate; wherein the fuse window structure is formed by removing subsequent layers overlaying the first, second, and third oxide regions, the subsequent layers including an etch stop overlaying the first, second and third oxide regions; wherein the etch stop comprises: a first etch stop layer substantially in register with the cutting site of the fuse; and a second etch stop layer above and in contact with the first etch stop layer, the second etch stop layer substantially in register with the entire fuse window structure; wherein the first etch stop layer is generally circular in shape.

2. A fuse window structure for a semiconductor device, the semiconductor device having a fuse formed on a substrate, the fuse having a cutting site, the fuse window having edges, the fuse window structure comprising: a first oxide region within the window substantially in register with the cutting site, the first oxide region having a first height from the substrate; a second oxide region within the window substantially in register with a first land generally surrounding the cutting site, the first land generally in register with the fuse, the second region having a second height from the substrate; a third oxide region within the window surrounding the fuse and extending to the edges of the window, the third region having a third height from the substrate, wherein the first height from the substrate is substantially the same as the second height from the substrate, and the second height from the substrate is greater than the third height from the substrate; wherein the fuse window structure is formed by removing portions of subsequent layers overlaying the first, second, and third oxide regions, the subsequent layers including an etch stop overlaying the first and second oxide regions; wherein the etch stop comprises: a first etch stop layer substantially in register with the fuse, the first etch stop layer having dimensions approximately equal to the fuse dimensions plus a margin for lithography overlay; wherein the fuse window structure further comprises a fourth oxide region overlaying the second and third oxide regions, the fourth oxide region substantially in register with a stress crack sensitive area of the fuse; wherein the etch stop further comprises: a second etch stop layer above the first etch stop layer, the second etch stop layer substantially in register with a stress crack sensitive area of the fuse.

3. The fuse window structure of claim 2 wherein the etch stop is made from a material selected from the group consisting of titanium, molybdenum, tungsten, chromium, and their silicides and nitrides.

* * * * *